US010418247B2

United States Patent
Murella et al.

(10) Patent No.: US 10,418,247 B2
(45) Date of Patent: Sep. 17, 2019

(54) COMPOSITE ABRASIVE PARTICLES FOR CHEMICAL MECHANICAL PLANARIZATION COMPOSITION AND METHOD OF USE THEREOF

(71) Applicant: Air Products and Chemicals, Inc., Allentown, PA (US)

(72) Inventors: Krishna P. Murella, Phoenix, AZ (US); Hongjun Zhou, Chandler, AZ (US); Dnyanesh Chandrakant Tamboli, Gilbert, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/208,334

(22) Filed: Jul. 12, 2016

(65) Prior Publication Data

US 2017/0133236 A1    May 11, 2017

Related U.S. Application Data

(63) Continuation of application No. 14/993,128, filed on Jan. 12, 2016, now Pat. No. 10,109,493, which is a continuation of application No. PCT/US2016/012993, filed on Jan. 12, 2016.

(60) Provisional application No. 62/286,606, filed on Jan. 25, 2016, provisional application No. 62/221,379, filed on Sep. 21, 2015.

(51) Int. Cl.
*H01L 21/306*     (2006.01)
*C09G 1/02*       (2006.01)
*H01L 21/3105*    (2006.01)
*C09K 3/14*       (2006.01)

(52) U.S. Cl.
CPC .......... *H01L 21/30625* (2013.01); *C09G 1/02* (2013.01); *C09K 3/1436* (2013.01); *C09K 3/1445* (2013.01); *H01L 21/31053* (2013.01)

(58) Field of Classification Search
CPC ...... C09G 1/02; C09K 3/1436; C09K 3/1445; H01L 21/30625; H01L 21/3212
USPC .................................................. 438/692, 693
See application file for complete search history.

(56) References Cited

U.S. PATENT DOCUMENTS

| 5,230,833 | A | 7/1993 | Romberger et al. |
| 2002/0025762 | A1 | 2/2002 | Luo et al. |
| 2004/0152309 | A1 | 8/2004 | Carter et al. |
| 2004/0211337 | A1 | 10/2004 | Lee et al. |
| 2009/0253355 | A1* | 10/2009 | Koyama ................. C09G 1/02 451/41 |

(Continued)

FOREIGN PATENT DOCUMENTS

| JP | 2013119131 A | * | 6/2013 |
| JP | 2013133255 A2 | | 7/2013 |

OTHER PUBLICATIONS

Wikipedia, "Ammonia Solution", via https://en.wikipedia.org/wiki/Ammonia_solution ; pp. 1-6; 2017.*

(Continued)

*Primary Examiner* — Binh X Tran
(74) *Attorney, Agent, or Firm* — Lina Yang (57) ABSTRACT

Polishing compositions comprising ceria coated silica particles offer minimal topography, reduced oxide and nitride losses, while providing high oxide polish rates. These formulations are especially useful for polishing large structures typically used in 3D NAND device manufacturing.

12 Claims, 4 Drawing Sheets

(56) References Cited

U.S. PATENT DOCUMENTS

| | | | | |
|---|---|---|---|---|
| 2012/0077419 A1* | 3/2012 | Zhang | ................ | C09K 3/1436 |
| | | | | 451/36 |
| 2012/0270400 A1* | 10/2012 | Takegoshi | ............... | C09G 1/02 |
| | | | | 438/692 |
| 2013/0241026 A1* | 9/2013 | Or-Bach | ............ | H01L 21/8221 |
| | | | | 257/506 |

OTHER PUBLICATIONS

Wu, Lixiao, Analytical Model for Chemical Mechanical Polishing of Features with Different Pattern Density, Journal of the Electrochemical Society, 153(7), 2006, pp. G669-G676.

Castillo-Mejia, D., et al. The Effect of Interactions Between Water and Polishing Pads on Chemical Mechanical Polishing Removal Rates, 150(20, 2003, pp. G76-G82.

Hsien, Y. H., et al., Microelectronic Engineering, vol. 92, 2012, pp. 19-23.

\* cited by examiner

COMPOSITE ABRASIVE PARTICLES FOR CHEMICAL MECHANICAL PLANARIZATION COMPOSITION AND METHOD OF USE THEREOF

CROSS REFERENCE TO RELATED APPLICATIONS

This application claims priority to U.S. provisional applications 62/221,379 filed on Sep. 21, 2015, U.S. application Ser. No. 14/993,128 filed on Jan. 12, 2016 and PCT Application U.S. Ser. No. 16/12993 filed on Jan. 12, 2016, US provisional application 62/286,606 filed Jan. 25, 2016, the entire contents of all are incorporated herein by reference thereto for all allowable purposes.

BACKGROUND OF THE INVENTION

The present invention relates to chemical mechanical planarization ("CMP") polishing compositions (CMP slurries, CMP composition or CMP formulations are used interchangeably) used in the production of a semiconductor device, and polishing methods for carrying out chemical mechanical planarization. In particular, it relates to polishing compositions comprising composite abrasive particles that are suitably used for polishing patterned semiconductor wafers that composed of oxide materials.

Silicon oxide is widely used as dielectric materials in semiconductor industry. There are several CMP steps in integrated circuit (IC) manufacturing process, such as shallow trench isolation (STI), inter-layer dielectric (ILD) CMP and gate poly CMP etc. Typical oxide CMP slurry involves: abrasive, with or without other chemicals. Other chemicals could be dispersants to improve slurry stability, booster to increase removal rate, or inhibitors to decrease removal rate and to stop on the other film, for example, SiN for STI application.

Among common abrasives used in CMP slurries, such as silica, alumina, zirconia, titania and so on, ceria is well-known for its high reactivity toward silica oxide and is widely used in STI CMP slurry for the highest oxide removal rate (RR) due to the high reactivity of ceria to silica.

Cook et al. (Lee M. Cook, Journal of Non-Crystalline Solids 120 (1990) 152-171) proposed a 'chemical tooth' mechanism to explain this extraordinary property of ceria. According to this mechanism, when ceria particles are pressed onto silicon oxide film, ceria breaks down silica bonds, forms a Ce—O—Si structure and thus cleavage silica from the surface.

As the semiconductor technology has evolved, there are a number of new applications that demand innovative CMP solutions to meet requirements of high silicon oxide removal rates and a high degree of planarity. One of such applications is in manufacturing three-dimensional (3D) memory structures. 3D memory structures stacks the memory cells vertically allowing a wider gap between each cell, overcoming the patterning restrictions. 3D NAND typically uses alternating layers of thick (height) oxides and nitride or oxide and conductor layers to form vertical NAND structures in the form of a staircase. Oxide layers are typically thicker (have a height greater) than 1 micron or 2 microns or 3 microns. In order to maintain throughput requirements, oxide layers need to be polished at very high rates, stop on the optional second film or stopping layer (located beneath the oxide layer) such as nitride or poly-Si layer and cause minimal dishing of the oxide trench structures. Many of the high rate oxide CMP slurries available in the market cause a dome-like topography during polishing. The dome or rounded features are formed of residual oxide in the oxide regions (active oxide regions) surrounding the trenches while polishing thick and wide oxide structures. It is important to minimize rounding of large oxide structures (thereby forming the dome-like topography) to minimize oxide loss in trenches and prevent complete loss of stopping layer in the areas adjacent to the trenches.

Therefore, there are significant needs for CMP compositions, methods, and systems that can offer higher removal rate of silicon oxide and high planarization efficiency, without forming the dome-like topography. Slurries should also have excellent stopping ability on silicon nitride or poly-Si films and provide low oxide loss for wide trench structures.

BRIEF SUMMARY OF THE INVENTION

Described herein are oxide material CMP polishing compositions, methods and systems that satisfy the need of polishing semiconductor wafer comprising large sized silicon oxide structures (with widths ranging from 0.1 mm to 50 mm) and trenches with widths ranging from 0.01 mm to 10 mm with minimal rounding (the formation of the dome-like topography) of the oxide features while providing very high removal rates.

A polishing composition is provided comprising composite particles comprising core particles with surfaces covered by nanoparticles;

one or more additives selected from polymeric carboxylic acids and salts thereof and one or more additives selected from polymers containing alkoxylate groups;

a pH-adjusting agent selected from the group consisting of sodium hydroxide, potassium hydroxide, cesium hydroxide, ammonium hydroxide, quaternary organic ammonium hydroxide, and combinations thereof; and DI water; wherein the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and the polishing composition has a pH of about 2 to about 12.

In one aspect of the invention the polishing composition the core particle is silica particle, the nanoparticle is ceria nanoparticle, wherein the silica is amorphous silica and the ceria nanoparticles are singly crystalline. In another aspect, alone or in combination with other aspects, the polishing composition of comprises polymeric carboxylic acids and salts thereof selected from the group consisting of polyacrylic acid, poly-methacrylic acid, poly(methyl methacrylate) (PMMA), polyvinyl alcohol and polystyrenesulfonic acid or salts thereof. In another aspect, alone or in combination with other aspects, the polishing composition of comprises polymers having alkoxylate groups are selected from the group consisting of polyethylene glycol and polyethylene oxide. In another aspect, alone or in combination with other aspects, the polishing composition of comprises polymeric carboxylic acids and salts thereof is ammonium polyacrylate and wherein said polyols having hydroxyl groups is polyethylene glycol. In another aspect, alone or in combination with other aspects, the polishing composition has a pH ranging from 4 to 10. In another aspect, alone or in combination with other aspects, the polishing composition of comprises ceria coated silica composite particles, and ammonium hydroxide; and having a pH ranging from 4 to 8.

In another aspect, alone or in combination with other aspects, a method of the invention is provided for chemical mechanical planarization of a semiconductor substrate comprising at least one surface having at least one oxide layer and at least one stopping layer beneath at least part of said at least one oxide layer, and at least one trench within said substrate, said at least one trench comprising a portion of said at least one oxide layer in said trench, said at least one trench having a trench width of greater than 0.01 mm, said at least one oxide layer comprises one or more active oxide regions located on either side of said at least one trench, said one or more active oxide regions having a width greater than 0.1 mm, comprising the steps of: contacting the at least one active oxide regions with a polishing pad; delivering a polishing composition to the at least one surface, the polishing composition comprising:

composite particles comprising core particles with surfaces covered by nanoparticles; an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, polymers with alkoxylate groups and combinations thereof; a pH-adjusting agent selected from the group consisting of sodium hydroxide, potassium hydroxide, cesium hydroxide, ammonium hydroxide, quaternary organic ammonium hydroxide, and combinations thereof; and DI water; wherein the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and the polishing composition has a pH of about 2 to about 12;

and C) polishing the at least one active oxide region with the polishing composition to expose said stopping layer.

In another aspect, alone or in combination with other aspects, the polishing the nanoparticle is ceria nanoparticle, and the composite particles are amorphous silica particles having surfaces covered by singly crystalline ceria nanoparticles. In another aspect, alone or in combination with other aspects, the polishing method or system comprises a polishing composition having a pH ranging from 4 to 10. In another aspect, alone or in combination with other aspects, the polishing method or system comprises a polishing composition further comprising one or more additives selected from polymeric carboxylic acids and salts thereof and one or more additives selected from the group consisting of polyols having hydroxyl groups. In another aspect, alone or in combination with other aspects, in the polishing method or system, the polishing composition comprises ceria coated silica composite particles, ammonium hydroxide; and has a pH ranging from 4 to 8. In another aspect, alone or in combination with other aspects, in the polishing method or system, the polishing composition comprises one or more additives selected from polymeric carboxylic acids and salts thereof selected from the group consisting of polyacrylic acid, poly-methacrylic acid, polyvinyl alcohol and polystyrenesulfonic acid or salts thereof, and said one or more additives selected from the group consisting of polymers with alkoxylate groups selected from the group consisting of polyethylene glycol and polyethylene oxide. In another aspect of the method or method, alone or in combination with other aspects, the at least one oxide layer is a silicon oxide layer and/or the polishing removal rate for the at least one oxide layer is equal to or greater than 5000 or 7000 or 9000 A/min. In another aspect, alone or in combination with other aspects, in the polishing the at least one trench has a trench width of 0.01 mm to 10 mm and at least one of the one or more active oxide regions has a width ranging from 0.1 mm to 50 mm. In another aspect, alone or in combination with other aspects, in the polishing method or system, the substrate has at least two trenches, and at least two active oxide regions, each of said at least two trenches having a trench width of 0.01 mm to 10 mm and each of said at least two active oxide regions, having a width ranging from 0.1 mm to 50 mm and/or the at least one of the one or more active oxide regions is greater than 1 micron in height prior to said polishing step. In another aspect, alone or in combination with other aspects, in the polishing system and method or system, the structure is used for 3D-NAND. In another aspect, alone or in combination with other aspects, the polishing composition, method or system comprises a polishing composition has a pH ranging from 4 to 10 and the change of size distribution of composite particles under a disintegrative force is less than 5%. In another aspect, alone or in combination with other aspects, the polishing composition, system or method comprises the polishing composition further comprises one or more additives selected from polymeric carboxylic acids and salts thereof selected from the group consisting of polyacrylic acid, poly-methacrylic acid, polyvinyl alcohol and polystyrenesulfonic acid or salts thereof, and one or more additives selected from the group consisting of polymers with alkoxylate groups selected from the group consisting of polyethylene glycol and polyethylene oxide.

Formulations of this invention are especially useful for polishing semiconductor wafers for 3D-NAND application.

CMP polishing compositions described herein comprise ceria coated silica particles and an additive for suppressing the removal rate of the stopping film.

Ceria coated silica particles comprise silica particles as the core particles covered with ceria nanoparticles forming a shell. The silica base particles are amorphous; and the ceria nanoparticles are singly crystalline.

The amount of nanoparticles covering the surface of the core particles preferably falls within the following range in terms of the solid weight ratio. The solid weight (b) of the nanoparticles relative to the solid weight (a) of the core particles is (b)/(a)=0.01 to 1.5, preferably 0.01 to 1.2.

Diameter of the ceria nanoparticles covering the core particle is preferably greater than 10 nm, preferably more than 13 nm. Having larger ceria particle diameter would allow higher removal rate to be possible.

Core particle size may range from 10 nm to 500 nm, preferably between 20 nm to 200 nm, most preferably between 50 nm and 150 nm.

Ceria coated silica particles are present in an amount from 0.01 wt % to 20 wt %, preferably, from 1 wt % to 10 wt %, more preferably, from about 3 wt % to about 8 wt %.

Chemical additive for suppressing removal rates of the stopping film may be a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, polymers with alkoxylate groups and combinations thereof. Preferred chemical additives are polyacrylic acid or its derivatives; polyethylene glycol; or mixtures of polyacrylic acid or its derivatives and polyethylene glycol. Preferred molecular weight of polyacrylic acid compound is between 1000 and 100,000, or between 5,000 and 50,000 or between 10,000 and 20,000. Polyethylene glycol molecular weight can be between 1,000 and 20,000, or between 5,000 and 15,000.

The total amount of the one or more chemical additives range from about 0.01 wt. % to 2 wt % relative to the total weight of the CMP composition. The preferred range is from about 0.05 wt % to 1% or from about 0.1 wt % ppm to 0.5 wt %.

CMP compositions may also optionally include other types of additives such as one or more of the following: pH adjusting agents, surfactants, dispersants and biological growth inhibitors.

The pH-adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures of any of the above.

The amount of pH-adjusting agent ranges from about 0.0001 wt % to about 5 wt % relative to the total weight of the CMP composition. The preferred range is from about 0.0005% to about 1 wt %, or from about 0.0005 wt % to about 0.5 wt %

The pH of the CMP composition ranges from about 2 to about 12. The preferred range is about 3 to about 10, or from about 4 to 7.5.

The CMP composition also comprises DI water. The DI water is present between from 60 wt % to 99 wt %, or 70 wt % to 98 wt % or 80 wt % to 95 wt %. In some embodiments, the DI water (if an amount is not specified) may be the balance (or remainder) of the CMP slurry composition.

Figure 3:
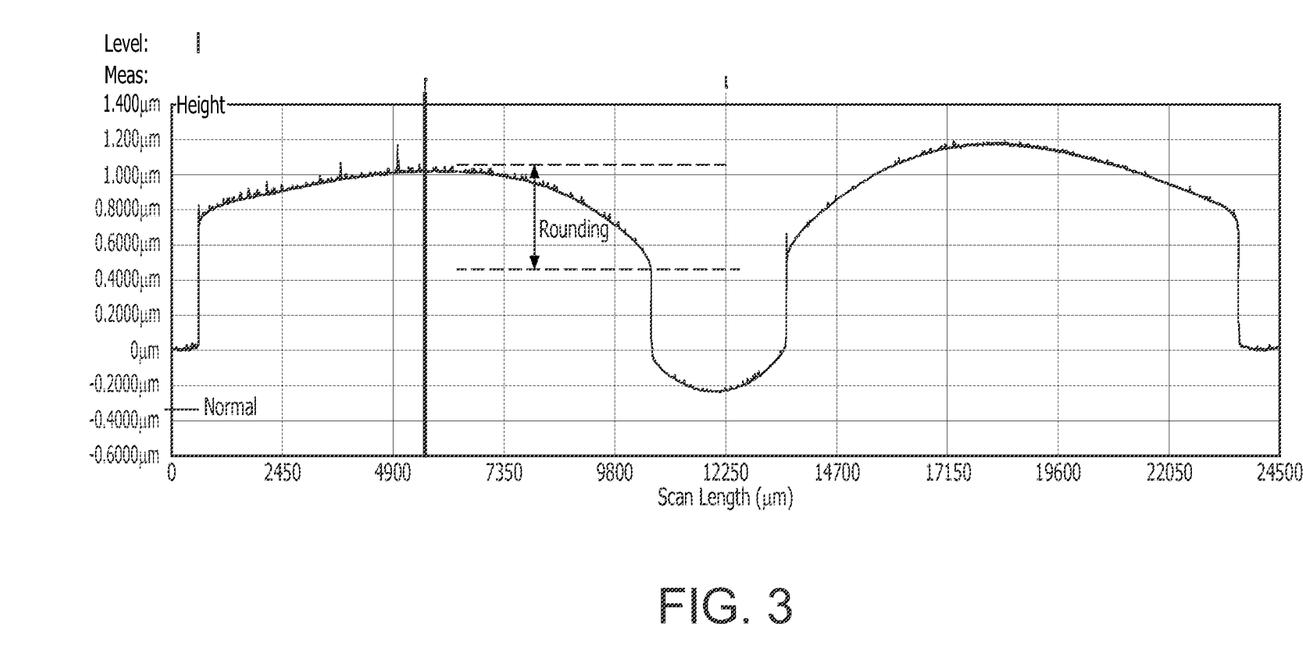
FIG. 3 shows a typical profilometer scan showing how the rounding of patterned structures is measured.

CMP slurry compositions of this invention, polish the oxide films at high rates and stopping films at low rates, thereby providing high throughput and ability to stop on the stopping films. In some embodiments, the CMP compositions of this invention are used to polish oxide layers thicker than 1 micron and stop on the second film (the stopping film) such as nitride or poly-Si. One such application of these polishing is in 3D-NAND memory fabrication. A typical structure would include at least one trench with at least one trench having a width from 0.1 mm to 10 mm, at least one active oxide regions with at least one active oxide region having a width from 1 micron to 50 mm. More typically, the structures would comprise at least two trenches with at least two trenches having widths from 0.1 mm to 10 mm. Additionally or alternatively, more typically the structure would comprise at least two active oxide regions with at least two active oxide regions having widths from 1 micron to 50 mm. CMP compositions described herein, can polish the active oxide regions at very high rates while minimizing formation of rounded topographic features resembling domes. Oxide removal rates are preferably greater than 5000 Å/min, or more preferably more than 7000 Å/min or most preferable greater than 9000 Å/min. It is desired that the maximum height of the rounding (maximum height of the dome features) when the stopping film starts to clear (to be exposed) from (beneath the) active oxide regions, is less than 1500 Å, or less than 1000 Å or less than 500 Å. These heights were measured for a 10 micron wide oxide regions separated by 3 micron trenches. For smaller (active) oxide regions, even smaller rounding heights can be achieved using the method and CMP slurry of this invention. For illustration purposes, FIG. 3 shows a structure that has 600 Å of maximum rounding height as measured by a profilometer. The top dashed line on FIG. 3 indicates the maximum height of the active oxide and the lower dashed line indicates the edge of the trench where the rounding begins. The difference between those two measurements is the maximum height of rounding.

DETAILED DESCRIPTION OF THE INVENTION

Described herein are oxide material CMP polishing compositions, methods and systems that satisfy the need of polishing semiconductor wafer comprising large sized silicon oxide structures (with widths ranging from 0.1 mm to 50 mm) and trenches with widths ranging from 0.01 mm to 10 mm with minimal rounding (the formation of the dome-like topography) of the oxide features while providing very high removal rates. Formulations of this invention are especially useful for polishing semiconductor wafers for 3D-NAND application.

Each of the composite abrasive particles has a core particle and many nanoparticles covering the surface of the core particle. The core particle is selected from the group consisting of silica, alumina, titania, zirconia, and polymer particle. The nanoparticles are selected from the group consisting of oxides of zirconium, titanium, iron, manganese, zinc, cerium, yttrium, calcium, magnesium, fluorine, lanthanum and strontium nanoparticles.

The amount of nanoparticles covering the surface of the core particles preferably falls within the following range in terms of the solid weight ratio. The solid weight (b) of the nanoparticles relative to the solid weight (a) of the core particles is (b)/(a)=0.01 to 1.5, preferably 0.01 to 1.2.

One of the examples of the composite particles is to have silica as the core particles and ceria as the nanoparticles; and each silica core particle has ceria nanoparticles covering its shell. The surface of each silica particle is covered by ceria nanoparticles. The silica base particles are amorphous; and the ceria nanoparticles are singly crystalline.

Diameter of the ceria nanoparticles covering the core particle is preferably greater than 10 nm, preferably more than 13 nm. Having larger ceria particle diameter would allow higher removal rate to be possible.

Core particle size may range from 10 nm to 500 nm, preferably between 20 nm to 200 nm, most preferably between 50 nm and 150 nm.

Another aspect of the present invention, involves using ceria coated silica particles that do not disintegrate under polishing forces. It is hypothesized that if the particles do not breakdown under the action of polishing forces (i.e. disintegrative forces) and keep the characteristic of original particle size, then the removal rate would remain high. If the particles on the other hand disintegrate under polishing forces, the removal rate would decrease owing to effectively smaller abrasive particle size. Breaking of the particles may also yield irregular shaped particles which may have undesirable effect on scratching defects. Particle stability under disintegrative forces can also be determined by subjecting the formulation to the ultrasonication treatment for half an hour and measuring the changes in size distribution. Preferred conditions for ultrasonication treatment are ½ hour immersion in bath with 42 KHZ frequency at 100 W output. Particle size distribution can be measured by using any suitable technique such as Disc Centrifuge (DC) method or Dynamic Light Scattering (DLS). Changes in size distribution can be characterized in terms of changes in mean particle size or D50 (50% particles below this size) or D99 (99% particles below this size) or any similar parameters. Preferably the changes in particle size distribution of ceria coated silica particles after ultrasonication treatment is less than 10%, more preferably less than 5% or most preferably less than 2%; by using for example DC and mean particle size, D50, D75 and/or D99. Using such stable particles in CMP slurry formulations would allow more effective utilization of polishing forces for film material removal and would also prevent generation of any irregular shapes that would contribute to scratching defects.

In another aspect of the present invention, the silica-based composite particle having an amorphous oxide layer including at least one type of element among aluminum, zirconium, titanium, iron, manganese, zinc, cerium, yttrium, calcium, magnesium, fluorine, lanthanum silicon, and strontium on the surface of an amorphous silica particle Å, and a crystalline oxide layer B including at least one type of element selected from among zirconium, titanium, iron, manganese, zinc, cerium, yttrium, calcium, magnesium, fluorine, lanthanum and strontium thereupon.

Figure 1A:
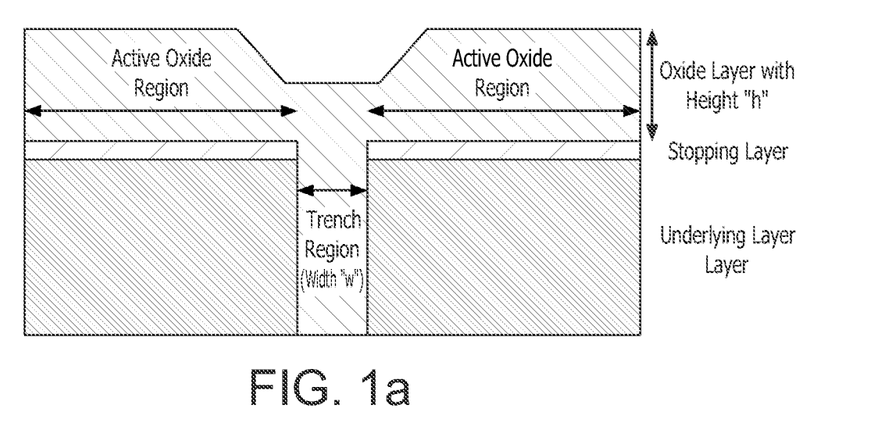
FIG. 1(a) shows the schematic cross-section of an exemplary structure prior to polishing.
Figure 1C:
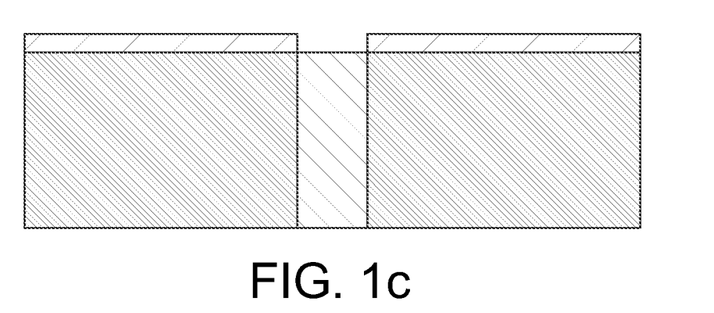
FIG. 1(c) shows the desired topography of the structure after polishing with a CMP slurry.
Figure 2A:
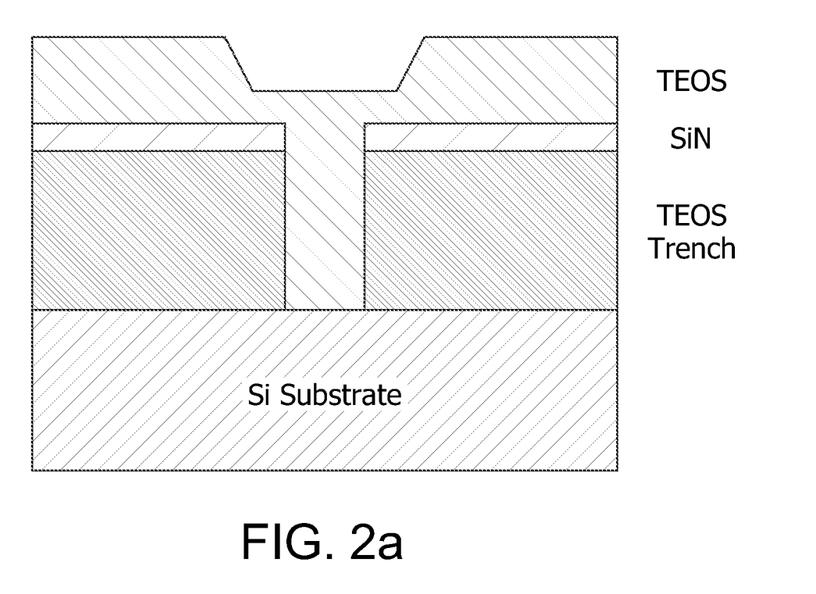
FIG. 2(a) shows a schematic of a cross-section of a portion of a substrate to be polished using the CMP slurry and the method of this invention.
Figure 2B:
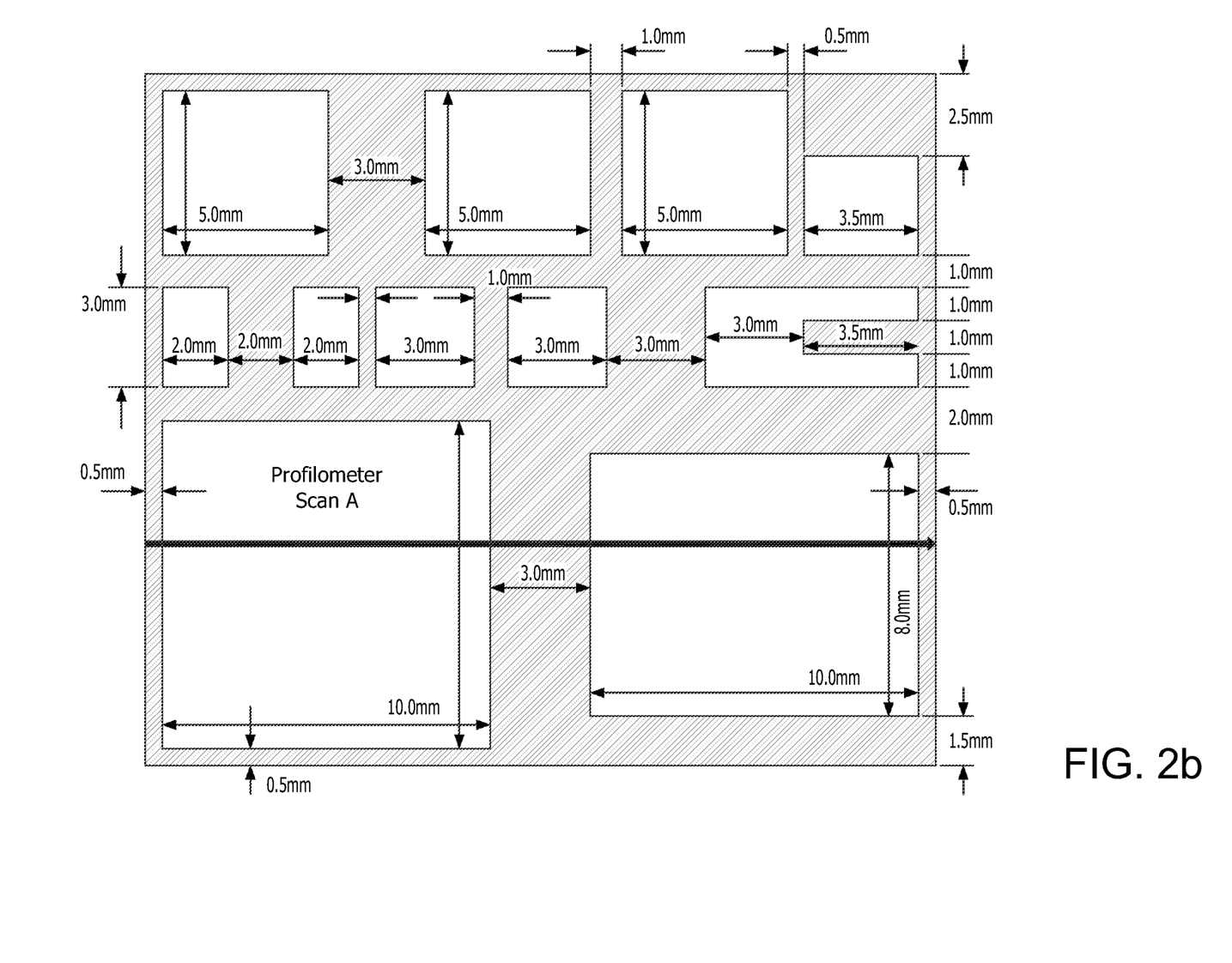
FIG. 2(b) shows a schematic of the pattern lay-out (the top surface) of a portion of a substrate (patterned wafers) polished in the examples described herein.

Since advanced CMP applications require extremely low levels metals such as sodium on the dielectric surface after polishing, it is desired to have very low trace metals, especially sodium in the slurry formulations. In certain preferred embodiments the formulations comprise ceria coated silica particles that have less than 5 ppm, more preferably less than 1 ppm most preferably less than 0.5 ppm of sodium impurity levels for each percent of particles in the formulations by weight. The composite particles are used as abrasive in the CMP compositions, formulations or slurries ("CMP composition", "CMP formulation", or CMP slurry" are used interchangeably). Note the terms, "film" and "layer" are used interchangeably herein. Any weight percentages (wt %) unless otherwise indicated are based on the total weight of the CMP formulation at the point of use. The height of a layer is measured from the top surface of a layer to the bottom of the layer interfacing with the underlying second layer. Height can be measured by taking a cross-section of the structure or by a suitable elliposometric technique. For example, the height h of the active oxide region is shown in FIG. 1(a). The width of a layer of a material on the top surface of a structure can be determined by visually inspecting and measuring the material on the top surface. Alternatively, the width can also be determined from a cross-section. The width w of a trench is shown in FIG. 2(b). The width of the structures shown in FIG. 2(b) are written on the structures in the figure. Note the term width will be used to mean both or either of the length and width of a region. So for example, the width of the stopping layer and the active oxide region thereon (shown as the white rectangle) in the bottom right corner of FIG. 2(b) is 10.0 mm or 8.0 mm. When following the Scan A arrow, the measured width of that same stopping layer and the active oxide region thereon is 10.0 mm. Note that oxide will also be present above the trench as shown in FIG. 1(a) and it should and will be removed with the active oxide regions located adjacent to the trench as shown in FIG. 1(a) to achieve the result shown in FIG. 1(c); however, the oxide located directly above the trench is not included in the "active oxide region" when the widths of the active oxide region are described herein. Oxide films are silicon oxide films only.

The CMP composition comprises composite particles, a pH adjusting agent that is used to adjust pH of the CMP composition to the optimized pH condition; a suitable chemical additive to enhance/suppress the removal rate of polish stop layer/film; optional additives; and the remaining being water.

Ceria coated silica particles are present in an amount from 0.01 wt % to 20 wt %, from 1 wt % to 10 wt %, or from about 3 wt % to about 8 wt %.

Chemical additive includes, but is not limited to a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, polymers comprising alkoxylate groups, and combinations thereof. Preferred chemical additives are polymeric carboxylic acids or salts thereof and polymers with alkoxylate groups. Polymeric carboxylic acids include but not limited to polyacrylic acid, poly-methacrylic acid, polyvinyl alcohol and polystyrenesulfonic acid. Polymeric carboxylic acids may include copolymers where one or more monomers could be carboxylic acids or its derivatives. Additives may also include salts of polymeric carboxylic acids, these may include but not limited to ammonium salts, potassium salts, cesium salts, various salts with quaternary ammonium hydroxide bases and salts with amine bases. It may be preferred for certain applications that the salt may not contain metals. Preferred polymeric carboxylic acid compound is ammonium polyacylate. Preferred molecular weight of polyacrylic acid compound is between 1000 and 100,000, or between 5,000 and 50,000 or between 10,000 and 20,000. Polymers comprising alkoxylate groups may include polymers and copolymers containing ethylene oxide repeating units, includes polyoxyethylene (POE), polypropylene glycol(PPG), and copolymer of POE and PPG.

An example is polyoxyethylene (POE), having the general molecular structure of wherein n refers to the total numbers of the repeating unit ranging from 4 to 125000; and the molecular weights (grams/mole) ranging from 200 to 5,000,000. A preferred range is from 1000 to 1000000; and the most preferred concentration range is from 10000 to 400000.

Polyoxyethylene (POE), is also called polyethylene oxide (PEO), or polyethylene glycol(PEG). The three names are chemically synonymous, but historically PEG has tended to refer to oligomers and polymers with a molecular mass below 20,000 g/mol, PEO to polymers with a molecular mass above 20,000 g/mol, and POE to a polymer of any molecular mass.

The ethoxylated surfactants are compounds that contain hydrophobic part as for example a hydrocarbon or polypropylene oxide chain as well as hydrophilic part which is the polyethylene oxide chain.

The suitable ethoxylated surfactants include, but are not limited to ethoxylated non-ionic surfactant, such as alkyl phenol ethoxylate, fatty alcohol ethoxylate, fatty amine ethoxylate and propylene oxide ethylene oxide block copolymers.

Preferred polymer with alkoxylate groups is polyethylene glycol. Its molecular weight can range from 1,000 to 20,000, and more preferably between 5,000 and 15,000.

The amount of (chemical) additive ranges from about 0.01 wt % to 2 wt % relative to the total weight of the CMP composition. The preferred range is from about 0.05 wt % to 1% or from about 0.1 wt % ppm to 0.5 wt %.

CMP compositions may also optionally include one or more of other types of additives such as pH adjusting agents, surfactants, dispersants or biological growth inhibitors and mixtures of any of the above.

The pH-adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures thereof.

The amount of pH-adjusting agent ranges from about 0.0001 wt % to about 5 wt % relative to the total weight of the CMP composition. The preferred range is from about 0.0005% to about 1 wt %, or from about 0.0005 wt % to about 0.5 wt %.

The pH of the CMP composition ranges from about 2 to about 12. The preferred range is about 3 to about 10 or from about 4 to 7.5.

The CMP composition may comprise a surfactant or a mixture of surfactants. Surfactants may be anionic, cationic, nonionic or zwitterionic in nature. While there are many suitable surfactant additives for the slurry, preferred surfactant additives include dodecyl sulfate sodium salt, sodium lauryl sulfate, dodecyl sulfate ammonium salt, alcohol ethoxylates, acetylenic surfactant, polyethyleneimine, ethoxylated fatty amine and stearylbenzyldimethylammonium chloride or nitrate and any combination thereof. Suitable commercially available surfactants include TRITON DF 16™ manufactured by Dow Chemicals and various surfactants in SUIRFYNOL™, DYNOL™, Zetasperse™, Nonidet™, and Tornado™ surfactant families, manufactured by Air Products and Chemicals.

Various anionic, cationic, nonionic and zwitterionic surfactants having molecular weight in the range from less than 1000 to greater than 30,000 are contemplated as dispersants. Included are sodium, potassium, or preferably ammonia salts of stearate, lauryl sulfate, alkyl polyphosphate, dodecyl benzene sulfonate, di-isopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate.

Addition of a surfactant may be useful to reduce the within-wafer-non-uniformity (WIWNU) of the wafers, thereby improving the surface of the wafer and reducing wafer defects.

The CMP composition may comprise a dispersing additive to stabilize particle dispersion.

The amount of surfactant ranges from about 0.0001 wt % to about 10 wt % relative to the total weight of the CMP composition. The preferred range is from about 0.001 wt % to about 1 wt %, or from about 0.005 wt % to about 0.1 wt %.

The suitable dispersing additive includes, but is not limited to organic acids and their salts; polymeric acids and their salts; water soluble copolymers and their salts; copolymers and their salts containing at least two different types of acid groups, such as carboxylic acid groups, sulfonic acid groups, or phosphonic acid groups in the same molecule of a copolymer, polyvinyl acid and salt thereof, polyethylene oxide, polypropylene oxide, and combinations thereof. Some examples of dispersants include: polyethylene glycols; lecithin; polyvinyl pyrrolidone; polyoxyethylene; isoctylphenyl ether; polyoxyethylene nonylphenyl ether; amine salts of alkylaryl sulfonates; polyacrylic acid, polymethacrylic acid and their salts.

The amount of dispersant ranges from about 0.0001 wt % to about 10 wt % relative to the total weight of the CMP composition. The preferred range is from about 0.001 wt % to about 1 wt % or from about 0.005 wt % to about 0.1 wt %.

Formulations may also comprise water soluble polymers which may comprise anionic or cationic or non-ionic or combinations of groups.

The CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

CMP formulations may be made in concentrated form and diluted at point of use by adding water. Alternatively formulations can be mixed at point of use by combining two or more components in order to avoid issues such as poor shelf life stability owing due to interactions between components.

The composite particles are used as abrasive in the CMP compositions, formulations or slurries ("CMP composition", "CMP formulation", or CMP slurry" are used interchangeably). The formulations comprising ceria coated silica composite particles can provide very high removal rates of silicon oxide films. Silicon oxide films may be generally referred to as oxide films in the description. Silicon oxide films could include a variety of films and materials including but not limited to thermal oxide, films deposited using Tetra Ethyl Ortho Silicate (TEOS) precursors, High Density Plasma (HDP) oxide, High Aspect Ratio Process (HARP) films, fluorinated oxide films, doped oxide films, Spin-On Glass (SOG), flowable Chemical Vapor Deposited (CVD) films, optical glass, display glass. These formulations can be used in stop-in-film applications, where the polishing is stopped once the topography is removed and a flat surface is achieved. Alternatively these formulations can be used in applications that involve polishing the bulk film and stopping at a stopping layer. Stopping layer may comprise a silicon nitride or poly-Si film. Silicon nitride film may be represented by a general formula $Si_xN_y$, where the ratio x/y may range from 0.1 to 10. The silicon nitride may also incorporate other elements such as but not limited to oxygen, carbon, nitrogen. Poly-Si films may also contain various doping additives.

Figure 1B:
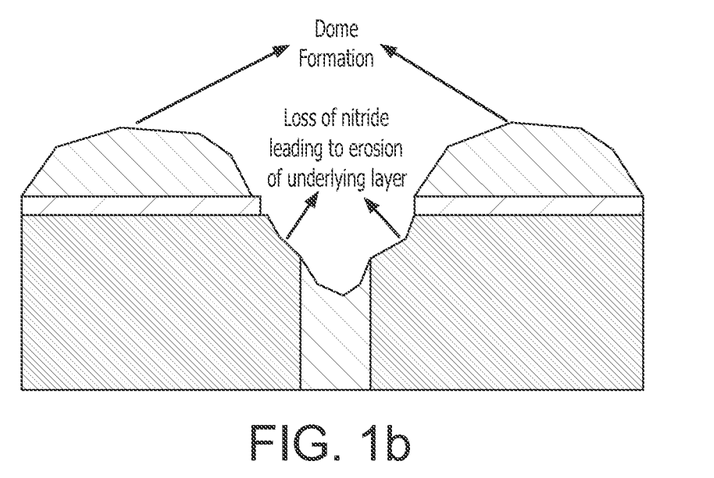
FIG. 1(b) shows dome structures that may result from polishing the structure shown in FIG. 1(a) when using a CMP slurry that is not of this invention.

CMP slurry compositions of this invention, polish the oxide films at high rates and stopping films at low rates, thereby providing high throughput and ability to stop on the stopping films. In some embodiments, the CMP compositions of this invention are used to polish oxide layers thicker than 1 micron and stop on the second (stopping) film such as nitride or poly-Si. One such application of these polishing is in 3D-NAND memory fabrication. FIG. 1(a) shows the schematic cross-section of the typical structure after the deposition of the active oxide layer onto a structure comprising a trench in an underlying layer, with a stopping layer located between the underlying layer and the active oxide layer. (The stopping layer is not located in the trench.) The trench structures are typically very wide (for example, more than 10 times or more than 100 times wider) as compared to other structures and processes, such as shallow trench isolation, that are used in semiconductor fabrication. A typical structure polished in the method of this invention would include trenches with widths that could range from 0.1 mm to 10 mm, or 0.5 mm to 10 mm, or 1 mm to 10 mm, and active oxide regions with widths that can extend from 1 micron to 50 mm, or 5 microns to 50 mm, or 10 microns to 50 mm. During polishing of wide structures, topographic features resembling domes are often formed. This dome or rounded shaped topography is associated with oxide residuals in the active region and substantial loss of oxides in the trench regions. FIG. 1b is a schematic showing dome shaped structures typically formed during polishing such wide structures. An extensive over-polish would be required in such cases to remove residual oxides from active regions which would lead to severe loss of oxide(s) from the trench, loss of the nitride stopping layer, as well as, damage to the underlying layers. FIG. 1(c) shows the desired topography after the CMP polishing step.

It is desired that the rounding (height of the dome features) when the stopping film starts to clear from the active oxide regions, is less than 1500 Å, or more preferably less than 1000 Å and most preferably less than 500 Å. These heights were measured for a 10 micron wide oxide regions separated by 3 micron trenches. For smaller (active) oxide regions, even smaller rounding heights can be achieved using the method and CMP slurry of this invention. CMP removal rates can be measured either based on thickness removed per unit time on blanket wafers or by thickness removed per unit time on a patterned wafer. In certain cases, patterned oxide rates may be substantially higher than the blanket oxide rates. Similarly, there may be discrepancies in the removal rates of stopping films in blanket vs. patterned structures. The mechanism of differences in blanket and patterned removal rates is not entirely known, but it may be dependent on how the additives interact with the film surfaces at the localized pressures on the patterned structures (wafers). In CMP manufacturing environment where throughput of patterned wafer CMP processing is a concern, high patterned oxide removal rates are acceptable even if the blanket oxide removal rates are low. In preferred embodiments, the silicon oxide films are polished at a rate greater than 5000 Å/min, or more preferably more than 7000 Å/min or most preferable greater than 9000 Å/min. Removal rate selectivity between the silicon oxide and the stopping film is preferably greater than 10, or greater than 30.

WORKING EXAMPLES

Polishing Pad IC1010 pad, supplied by Dow Corporation;
TEOS oxide films by Chemical Vapor Deposition (CVD) using tetraethylorthosilicate as the precursor
HDP oxide films made by high density plasma (HDP) technique
SiN films—Silicon nitride films
Parameters:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed or table-speed of polishing tool, in rpm (revolution(s) per minute)
SF: polishing composition flow, ml/min
Removal Rates and Selectivity
Removal Rate (RR)=(film thickness before polishing— film thickness after polishing)/polish time.
TEOS RR Measured TEOS removal rate at 4.7 psi down pressure and 87 RPM table-speed of the CMP tool
HDP RR Measured HDP removal rate at 4.7 psi down pressure and 87 RPM table-speed of the CMP tool
SiN RR Measured SiN removal rate at 4.7 psi down pressure and 87 RPM table-speed of the CMP tool
Selectivity of TEOS/SiN=TEOS RR/SiN RR; HDP/SiN=HDP RR/SiN RR at same down force and table-speed (psi)
All percentages are weight percentages unless otherwise indicated.

General Experimental Procedure

In the examples presented below, CMP experiments were run using the procedures and experimental conditions given below.
The CMP tool that was used in the examples is a Mirra®, manufactured by Applied Materials, 3050 Boweres Avenue, Santa Clara, Calif., 95054. IC1010 pads from Dow Chemicals were used for polishing.
The oxide film thickness specifications are summarized below:
TEOS: 15,000 Å
HDP: 10,000 Å
3D NAND Integration test wafers used in the examples below were purchased from Silyb Wafer Services. FIGS. 2(a) and 2(b) show schematics of the cross-section and the pattern lay-out of wafers respectively. The trench height was 20,000 Å. A 30,000 TEOS layer was deposited over the wafer to fill in the trench. SiN layer thickness was 500 Å.

The pattern wafers were scanned using P17 profilometer (Manufactured by KLA Tencor) to measure the topography. The scans were performed along 10 micron×10 micron and 10 micron×8 micron structures as marked by Scan A in the pattern layout shown in FIG. 2. FIG. 3 shows a typical profilometer scan showing how the rounding is measured.

Oxide thickness measurements on patterned structures were performed using Therma-Wave Opti-Probe 3290 DUV tool. The measurements were performed along scan A line shown in FIG. 2(b). The average thickness of oxide in the trench was calculated based on the measurements of 29 points in the 3 mm trench. Oxide loss in the trenches is calculated by subtracting average oxide thickness in the trenches after polishing from the trench height (2 microns). The average thickness of oxide in the active region was calculated based on the measurements of 99 points along the 10 mm scan in the active oxide region. Patterned wafer active TEOS oxide removal rate was calculated based on change in oxide thickness in the active regions after 60 second polish.

Pattern clear time was determined as the time at which the nitride layer is first exposed.

Ceria coated silica particles (CPOP-20) used in the examples were procured from JGC C&C Ltd (Kawasaki City, Japan). CPOP-20 particles are made by the methods described in JP20131191131, JP2013133255, JP2015-169967, and JP2015-183942. Mean particle size of these particles measured by Disc Centrifuge analysis method (DC24000 UHR from CPS Instruments) was 97.7 Comparative abrasive particles included calcined ceria particles (Mean Particle Size: 99 nm) and colloidal ceria particles with mean particle size 110 nm (HC-60 ceria particles from Solvay, Rhodia Inc, 8 Cedar Brook Dr., Canbury, N.J.)

Example 1

The CMP compositions comprised abrasive particles, 0.12 wt % ammonium polyacrylate (Molecular Weight 16000-18000), ammonium hydroxide, and water. The CMP compositions had a pH of 5. Three different abrasive particle types were used; calcined ceria, colloidal ceria and ceria coated silica particles. The particle concentrations was varied from 1 wt % to 5 wt %. Polishing was performed on IC1000 pad with 87 RPM table speed and 4.7 psi membrane pressure with 200 ml/min slurry flow rate.

These formulations were used to polish TEOS (oxide films deposited using Chemical Vapor Deposition technique with tetraethyl orthosilicate precursor), HDP (Oxide film deposited with High Density Plasma technique) and SiN blanket films. Table 1 provides the removal rates and polish selectivity data for these films.

TABLE 1

| | % Abrasive Particles | Removal Rate (Å/min) | | | Removal Rate Selectivity | |
|---|---|---|---|---|---|---|
| | | TEOS | HDP | SiN | TEOS/Nitride Selectivity | HDP/Nitride Selectivity |
| Calcined Ceria | 1% | 3336 | 2905 | 171 | 20 | 17 |
| | 3% | 5784 | 4411 | 209 | 28 | 21 |
| | 5% | 6347 | 5857 | 228 | 28 | 26 |
| Colloidal Ceria (HC60) | 1% | 2508 | 2031 | 191 | 13 | 11 |
| | 3% | 2693 | 3493 | 219 | 12 | 16 |
| | 5% | 5151 | 4404 | 232 | 22 | 19 |
| Ceria Coated | 1% | 4016 | 5540 | 204 | 20 | 27 |
| | 3% | 9547 | 9116 | 244 | 39 | 37 |

TABLE 1-continued

| | % Abrasive Particles | Removal Rate (Å/min) | | | Removal Rate Selectivity | |
|---|---|---|---|---|---|---|
| | | TEOS | HDP | SiN | TEOS/Nitride Selectivity | HDP/Nitride Selectivity |
| Silica Particles | 5% | 11904 | 11825 | 272 | 44 | 43 |

It is evident that for the CMP slurries comprising calcined and colloidal ceria, achieving removal rates of more than 10,000 Å/min, that is required for several oxide polishing applications, would require very high concentrations of abrasive particles. Slurries with very high concentrations of ceria based particles, such as greater than 7 wt % are considered unpractical for commercial applications because of cost and high defectivity associated with high concentration of ceria particles. Ceria coated silica particles not only provide high removal rates of oxide films, but they also offer a high oxide to nitride removal rate selectivity, which is beneficial for polishing 3D-NAND structures.

Example 2

CMP compositions were made comprising 5 wt % ceria coated silica particles, 0.12 wt % ammonium polyacrylate (Molecular Weight 16000-18000), ammonium hydroxide, and water being balance. The pH was adjusted to different values using ammonium hydroxide. Table 2 provides the removal rates on TEOS, HDP and SiN films along with removal rate selectivity between the films with these formulations.

Increasing the pH to and/or above 7 seems to increase the SiN rates and thus reduce the oxide/nitride selectivity. pH lower than 7 is more suitable to achieve high oxide rates and providing a stop on nitride films.

TABLE 2

| | Removal Rate (Å/min) | | | Removal Rate Selectivity | |
|---|---|---|---|---|---|
| pH | TEOS | HDP | SiN | TEOS/Nitride Selectivity | HDP/Nitride Selectivity |
| 5 | 11904 | 11825 | 272 | 44 | 43 |
| 6 | 13595 | 11924 | 296 | 46 | 40 |
| 7 | 13299 | 11935 | 1303 | 10 | 9 |
| 8 | 12656 | 12141 | 1389 | 9 | 9 |

Example 3

3D NAND test wafers were polished using an IC1010 pad at 3 psi down-force and 126 RPM table speed with 200 ml/min slurry flow. The slurry formulations comprised 5 wt % abrasive particles, 0.12 wt % ammonium polyacrylate (Molecular weight 16,000-18,000) and DI water. Two types of abrasive particles were compared, calcined ceria and ceria coated silica particles.

Table 3 summarizes the patterned wafer data. It was determined that during 60 second polish, the amount of active oxide regions removed using the CMP slurry formulation with calcined ceria was 4976 Å, whereas the formulation with ceria coated silica particles removed 13515 Å of active oxide regions. The results are consistent with the blanket oxide results. Surface profilometry showed using formulations with ceria coated silica particles, there is very little rounding (297 Å). Formulations made with conventional calcined provide unacceptably high rounding (4396 Å).

TABLE 3

Effect of abrasive type on rounding

| Abrasive | Active Oxide removal in 60 second polish (Å) | Rounding at Clear |
|---|---|---|
| Calcined ceria | 4976 | 4396 |
| Ceria Coated Silica | 13515 | 297 |

Example 4

CMP compositions comprised: 5 wt % of ceria coated silica as the abrasive, different additives (ammonium polyacrylate (Molecular Weight 16000-18000) and polyethylene glycol (PEG) (Molecular weight 8000), and ammonium hydroxide to adjust the pH to 5. 3D-NAND test wafers and blanket TEOS wafers were polished with the same process conditions described in Example 3. Table 4 summarizes the polish test data.

TABLE 4

Effect of additives on rounding and oxide loss in trenches

| Additive | Blanket TEOS Removal Rate (Å/min) | Patterned Oxide Removal Rate (Å/min) | Trench Oxide Loss (Å) at Clear | Rounding (Å)@ clear |
|---|---|---|---|---|
| 0.12% Ammonium Polyacrylate | 7923 | 13515 | 3532 | 297 |
| 0.3% Ammonium Polyacrylate | 2041 | 11334 | 1730 | 586 |
| 0.375% Ammonium Polyacrylate | 1831 | 10314 | 1501 | 484 |
| 0.12% Ammonium Polyacrylate + 0.077% PEG | 5101 | 11680 | 1701 | 758 |
| 0.12% PEG | 7000 | 10351 | 1341 | 250 |

The results show that by increasing the ammonium polyacrylate concentrations, trench oxide loss is substantially reduced. While increase in ammonium polyacrylate concentration reduces blanket removal rates, there is no significant effect on patterned oxide removal rates. Polyethylene glycol by itself or in combination with ammonium polyacrylate is able to substantially able to reduce trench oxide loss while having high blanket and patterned oxide removal rates. Rounding with both types of additives is very low. Dispersions of particles in water were tested for the stability under a disintegrative force that is under ultrasonic disintegration.

Example 5

Dispersions of particles in water were tested for the stability under a disintegrative force, that is, under ultrasonic disintegration.

The experiment was performed in Branson 2510R-MI Sonic bath with a 100 watt output at 42 KHz. Ceria coated silica CPOP-20 particles as described in example 1 were compared against CP2 particles that were prepared as per the method described in US 2012/0077419 for comparison. Mean Particle Size (MPS) measured by Disc Centrifuge Analysis was 41 nm.

TABLE 3

| sample | MPS (nm, DC) | d50 (nm, DC) | d75 (nm, DC) | d99 (nm, DC) |
|---|---|---|---|---|
| CPOP-20 | 97.7 | 94.7 | 114.8 | 172.0 |
| CPOP-20 sonicated 30 min | 96.7 | 94.1 | 114.3 | 171.1 |
| Change % | 1.0% | 0.6% | 0.4% | 0.5% |
| CP2 | 41.1 | 35.7 | 45.0 | 136.4 |
| CP2 sonicated 30 min | 33.6 | 30.4 | 36.7 | 77.0 |
| Change % | 18.2% | 14.8% | 18.4% | 43.5% |

The particle size distribution as measured by Disc Centrifuge method (DC24000 UHR from CPS Instruments) before and after ultrasonication treatments for CPOP-20 and CP2 particles were shown in Table 3 respectively.

The results indicated that the particles used in formulations of this invention did not show change in size distribution, indicating a strong bonding between core and the coated particles.

The change in size distribution of CP2 particles was >14%. Data in Table 3 also showed that the particle size distribution shifting towards smaller particles, indicating that composite particles may not be stable, such as the weak bonding between core and the coated particles.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A polishing method for chemical mechanical planarization of a semiconductor substrate comprising at least one surface having at least one oxide layer and at least one stopping layer beneath at least part of said at least one oxide layer, and at least one trench within said substrate, said at least one trench comprising a portion of said at least one oxide layer in said trench, said at least one trench having a trench width of greater than 0.01 mm, said at least one oxide layer comprises one or more active oxide regions located on either side of said at least one trench, said one or more active oxide regions having a width greater than 0.1 mm, comprising the steps of:
    a) contacting the at least one surface with a polishing pad;
    b) delivering a polishing composition to the at least one surface, the polishing composition consisting essentially of:

composite particles comprising core particles with surfaces covered by nanoparticles;

an additive selected from a compound having a functional group selected from the group consisting of organic carboxylic acids, amino acids, aminocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, polymers with alkoxylate groups and combinations thereof;

a pH-adjusting agent selected from the group consisting of sodium hydroxide, potassium hydroxide, cesium hydroxide, ammonium hydroxide, quaternary organic ammonium hydroxide, and combinations thereof;

and

DI water;

wherein the core particle is selected from the group consisting of silica, alumina, titania, zirconia, polymer particle, and combinations thereof; and the nanoparticles are selected from the compounds of the group consisting of zirconium, titanium, iron, manganese, zinc, cerium, yttrium, calcium, magnesium, fluorine, lanthanum, strontium nanoparticle, and combinations thereof; and the polishing composition has a pH of about 2 to about 12;

and

C) polishing the at least one surface with the polishing composition to expose said stopping layer.

2. The method of claim 1, wherein the composite particles in the polishing composition are ceria coated silica composite particles, the pH-adjusting agent in the polishing composition is ammonium hydroxide; and the polishing composition has a pH ranging from 4 to 8.

3. The method of claim 1 wherein at least one trench has a trench width of ≥0.5 mm and at least one of the one or more active oxide regions has a width ≥2.0 mm.

4. The method of claim 1 wherein said substrate has at least two trenches, and at least two active oxide regions, each of said at least two trenches having a trench width of ≥0.5 mm to 10 mm and each of said at least two active oxide regions, having a width ≥2.0 mm to 50 mm.

5. The method of claim 1 wherein at least one of the one or more active oxide regions is greater than 1 micron in height prior to said polishing step.

6. The method of claim 1 wherein the structure is used for 3D-NAND memory fabrication.

7. The method of claim 1, wherein the nanoparticles are ceria nanoparticle, and the composite particles are amorphous silica particles having surfaces covered by singly crystalline ceria nanoparticles.

8. The method of claim 7, wherein the polishing composition has a pH ranging from 4 to 10.

9. The method of claim 1, wherein the the additive in the polishing composition is selected from polymeric carboxylic acids and salts thereof; polymers with alkoxylate groups; and combinations thereof.

10. The method of claim 9, wherein said polymeric carboxylic acids and salts thereof are selected from the group consisting of polyacrylic acid, poly-methacrylic acid, polyvinyl alcohol and polystyrenesulfonic acid or salts thereof, and said polymers with alkoxylate groups are selected from the group consisting of polyethylene glycol and polyethylene oxide.

11. The method of claim 1, wherein the at least one oxide layer is a silicon oxide layer.

12. The method of claim 11, wherein polishing removal rate for the at least one oxide layer is equal to or greater than 5000 A/min.

* * * * *